US007772632B2

(12) United States Patent
Haller et al.

(10) Patent No.: US 7,772,632 B2
(45) Date of Patent: Aug. 10, 2010

(54) MEMORY ARRAYS AND METHODS OF FABRICATING MEMORY ARRAYS

(75) Inventors: Gordon A. Haller, Boise, ID (US); Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 621 days.

(21) Appl. No.: 11/507,696

(22) Filed: Aug. 21, 2006

(65) Prior Publication Data

US 2008/0042179 A1    Feb. 21, 2008

(51) Int. Cl.
*H01L 27/108* (2006.01)
*H01L 29/76* (2006.01)
*H01L 29/94* (2006.01)
*H01L 31/119* (2006.01)

(52) U.S. Cl. ...................... 257/296; 257/332
(58) Field of Classification Search ......... 257/295–310, 257/328–334, E27.096, E27.055, E27.58, 257/E27.57, E27.086
See application file for complete search history.

(56) References Cited

U.S. PATENT DOCUMENTS

| 4,455,740 | A | 6/1984 | Hiroshi |
| 4,835,741 | A | 5/1989 | Baglee |
| 4,922,460 | A | 5/1990 | Furutani et al. |
| 4,931,409 | A | 6/1990 | Nakajima et al. |
| 4,937,641 | A | 6/1990 | Sunami et al. |
| 5,013,680 | A | 5/1991 | Lowrey et al. |
| 5,021,355 | A | 6/1991 | Dhong et al. |
| 5,047,117 | A | 9/1991 | Roberts |
| 5,107,459 | A | 4/1992 | Chu et al. |
| 5,108,938 | A | 4/1992 | Solomon |
| 5,122,848 | A | 6/1992 | Lee et al. |
| 5,160,491 | A | 11/1992 | Mori |
| 5,254,218 | A | 10/1993 | Roberts et al. |
| 5,281,548 | A | 1/1994 | Prall |
| 5,376,575 | A | 12/1994 | Kim et al. |
| 5,392,237 | A | 2/1995 | Iida |
| 5,413,949 | A | 5/1995 | Hong |
| 5,446,299 | A | 8/1995 | Acovic et al. |
| 5,472,893 | A | 12/1995 | Iida |

(Continued)

FOREIGN PATENT DOCUMENTS

DE    44 08 764 A1    9/1994

(Continued)

OTHER PUBLICATIONS

PCT/US2004/034587, Jun. 9, 2005, PCT Written Opinion.

(Continued)

*Primary Examiner*—Cuong Q Nguyen
(74) *Attorney, Agent, or Firm*—Wells St. John P.S.

(57) ABSTRACT

A memory array includes a plurality of memory cells formed on a semiconductor substrate. Individual of the memory cells include first and second field effect transistors respectively comprising a gate, a channel region, and a pair of source/drain regions. The gates of the first and second field effect transistors are hard wired together. A conductive data line is hard wired to two of the source/drain regions. A charge storage device is hard wired to at least one of the source/drain regions other than the two. Other aspects and implementations are contemplated, including methods of fabricating memory arrays.

59 Claims, 7 Drawing Sheets

U.S. PATENT DOCUMENTS

| | | | |
|---|---|---|---|
| 5,480,838 | A | 1/1996 | Mitsui |
| 5,502,320 | A | 3/1996 | Yamada et al. |
| 5,504,357 | A | 4/1996 | Kim et al. |
| 5,512,770 | A | 4/1996 | Hong |
| 5,514,604 | A | 5/1996 | Brown |
| 5,573,837 | A | 11/1996 | Roberts et al. |
| 5,574,621 | A | 11/1996 | Sakamoto et al. |
| 5,612,559 | A | 3/1997 | Park et al. |
| 5,619,057 | A | 4/1997 | Komatsu |
| 5,714,412 | A | 2/1998 | Liang et al. |
| 5,714,786 | A | 2/1998 | Gonzalez et al. |
| 5,739,066 | A | 4/1998 | Pan |
| 5,753,947 | A | 5/1998 | Gonzalez |
| 5,763,305 | A | 6/1998 | Chao |
| 5,792,687 | A | 8/1998 | Jeng et al. |
| 5,792,690 | A | 8/1998 | Sung |
| 5,798,544 | A | 8/1998 | Ohya et al. |
| 5,817,552 | A | 10/1998 | Roesner et al. |
| 5,869,359 | A | 2/1999 | Prabhakar |
| 5,909,618 | A | 6/1999 | Forbes et al. |
| 5,963,469 | A | 10/1999 | Forbes |
| 5,972,754 | A | 10/1999 | Ni et al. |
| 5,977,579 | A | 11/1999 | Noble |
| 6,005,273 | A | 12/1999 | Gonzalez et al. |
| 6,015,990 | A | 1/2000 | Hieda et al. |
| 6,033,963 | A | 3/2000 | Huang et al. |
| 6,072,209 | A | 6/2000 | Noble et al. |
| 6,090,693 | A | 7/2000 | Gonzalez et al. |
| 6,096,596 | A | 8/2000 | Gonzalez |
| 6,114,735 | A | 9/2000 | Batra et al. |
| 6,124,611 | A | 9/2000 | Mori |
| 6,127,699 | A | 10/2000 | Ni et al. |
| 6,150,687 | A | 11/2000 | Noble et al. |
| 6,168,996 | B1 | 1/2001 | Numazawa et al. |
| 6,184,086 | B1 | 2/2001 | Kao |
| 6,187,643 | B1 | 2/2001 | Borland |
| 6,191,470 | B1 | 2/2001 | Forbes et al. |
| 6,215,149 | B1 | 4/2001 | Lee et al. |
| 6,225,669 | B1 | 5/2001 | Long et al. |
| 6,255,165 | B1 | 7/2001 | Thurgate et al. |
| 6,259,142 | B1 | 7/2001 | Dawson et al. |
| 6,297,106 | B1 | 10/2001 | Pan et al. |
| 6,300,177 | B1 | 10/2001 | Sundaresan et al. |
| 6,323,506 | B1 | 11/2001 | Alok |
| 6,337,497 | B1 | 1/2002 | Hanafi et al. |
| 6,340,614 | B1 | 1/2002 | Tseng |
| 6,348,385 | B1 | 2/2002 | Cha et al. |
| 6,349,052 | B1 | 2/2002 | Hofmann et al. |
| 6,362,506 | B1 | 3/2002 | Miyai |
| 6,383,879 | B1 | 5/2002 | Kizilyalli et al. |
| 6,391,726 | B1 | 5/2002 | Manning |
| 6,414,356 | B1 | 7/2002 | Forbes et al. |
| 6,417,085 | B1 | 7/2002 | Batra et al. |
| 6,420,786 | B1 | 7/2002 | Gonzalez et al. |
| 6,476,444 | B1 | 11/2002 | Min |
| 6,495,474 | B1 | 12/2002 | Rafferty et al. |
| 6,495,890 | B1 | 12/2002 | Ono |
| 6,498,062 | B2 * | 12/2002 | Durcan et al. ............... 257/302 |
| 6,552,401 | B1 | 4/2003 | Dennison |
| 6,563,183 | B1 | 5/2003 | En et al. |
| 6,566,193 | B2 | 5/2003 | Hofmann et al. |
| 6,573,559 | B2 | 6/2003 | Kitada et al. |
| 6,586,808 | B1 | 7/2003 | Xiang et al. |
| 6,624,032 | B2 | 9/2003 | Alavi et al. |
| 6,630,720 | B1 | 10/2003 | Maszara et al. |
| 6,632,714 | B2 | 10/2003 | Yoshikawa |
| 6,632,723 | B2 | 10/2003 | Watanabe et al. |
| 6,696,746 | B1 | 2/2004 | Farrar et al. |
| 6,717,200 | B1 | 4/2004 | Schamberger et al. |
| 6,727,137 | B2 | 4/2004 | Brown |
| 6,753,228 | B2 | 6/2004 | Azam et al. |
| 6,818,515 | B1 | 11/2004 | Lee et al. |
| 6,818,937 | B2 | 11/2004 | Noble et al. |
| 6,818,947 | B2 | 11/2004 | Grebs et al. |
| 6,844,591 | B1 | 1/2005 | Tran |
| 6,864,536 | B2 | 3/2005 | Lin et al. |
| 6,888,198 | B1 | 5/2005 | Krivokapic |
| 6,888,770 | B2 | 5/2005 | Ikehashi |
| 6,916,711 | B2 | 7/2005 | Yoo |
| 6,924,190 | B2 | 8/2005 | Dennison |
| 6,939,763 | B2 | 9/2005 | Schlosser et al. |
| 6,969,662 | B2 | 11/2005 | Fazan et al. |
| 7,005,710 | B1 | 2/2006 | Gonzalez et al. |
| 7,027,334 | B2 | 4/2006 | Ikehashi et al. |
| 7,030,436 | B2 | 4/2006 | Forbes |
| 7,042,009 | B2 | 5/2006 | Shaheen et al. |
| 7,071,043 | B2 | 7/2006 | Tang et al. |
| 7,091,092 | B2 | 8/2006 | Sneelal et al. |
| 7,122,425 | B2 | 10/2006 | Chance et al. |
| 7,125,774 | B2 | 10/2006 | Kim et al. |
| 7,135,371 | B2 | 11/2006 | Han et al. |
| 7,214,621 | B2 | 5/2007 | Nejad et al. |
| 7,244,659 | B2 | 7/2007 | Tang et al. |
| 7,262,089 | B2 | 8/2007 | Abbott et al. |
| 7,282,401 | B2 | 10/2007 | Juengling |
| 7,285,812 | B2 | 10/2007 | Tang et al. |
| 7,349,232 | B2 | 3/2008 | Wang et al. |
| 7,361,569 | B2 | 4/2008 | Tran et al. |
| 7,384,849 | B2 | 6/2008 | Parekh et al. |
| 7,390,746 | B2 | 6/2008 | Bai et al. |
| 7,393,789 | B2 | 7/2008 | Abatchev et al. |
| 7,396,781 | B2 | 7/2008 | Wells |
| 7,413,981 | B2 | 8/2008 | Tang et al. |
| 7,429,536 | B2 | 9/2008 | Abatchev et al. |
| 7,435,536 | B2 | 10/2008 | Sandhu et al. |
| 7,455,956 | B2 | 11/2008 | Sandhu et al. |
| 7,465,616 | B2 | 12/2008 | Tang et al. |
| 7,488,685 | B2 | 2/2009 | Kewley |
| 7,547,640 | B2 | 6/2009 | Abatchev et al. |
| 7,547,945 | B2 | 6/2009 | Tang et al. |
| 7,560,390 | B2 | 7/2009 | Sant et al. |
| 7,589,995 | B2 | 9/2009 | Tang et al. |
| 2001/0017390 | A1 | 8/2001 | Long et al. |
| 2001/0025973 | A1 | 10/2001 | Yamada et al. |
| 2001/0038123 | A1 | 11/2001 | Yu |
| 2001/0052617 | A1 | 12/2001 | Kitada et al. |
| 2002/0127796 | A1 | 9/2002 | Hofmann et al. |
| 2002/0130378 | A1 | 9/2002 | Forbes et al. |
| 2002/0135030 | A1 | 9/2002 | Horikawa |
| 2002/0153579 | A1 | 10/2002 | Yamamoto |
| 2002/0163039 | A1 | 11/2002 | Clevenger et al. |
| 2002/0192911 | A1 | 12/2002 | Parke |
| 2003/0001290 | A1 | 1/2003 | Nitayama et al. |
| 2003/0011032 | A1 | 1/2003 | Umebayashi |
| 2003/0042512 | A1 | 3/2003 | Gonzalez |
| 2003/0092238 | A1 | 5/2003 | Eriguchi |
| 2003/0094651 | A1 | 5/2003 | Suh |
| 2003/0161201 | A1 | 8/2003 | Sommer et al. |
| 2003/0164527 | A1 | 9/2003 | Sugi et al. |
| 2003/0169629 | A1 | 9/2003 | Goebel et al. |
| 2003/0170955 | A1 | 9/2003 | Kawamura et al. |
| 2003/0234414 | A1 | 12/2003 | Brown |
| 2004/0009644 | A1 | 1/2004 | Suzuki |
| 2004/0034587 | A1 | 2/2004 | Amberson et al. |
| 2004/0061148 | A1 | 4/2004 | Hsu |
| 2004/0070028 | A1 | 4/2004 | Azam et al. |
| 2004/0125636 | A1 | 7/2004 | Kurjanowicz et al. |
| 2004/0184298 | A1 | 9/2004 | Takahashi et al. |
| 2004/0197995 | A1 | 10/2004 | Lee et al. |
| 2004/0222458 | A1 | 11/2004 | Hsieh et al. |
| 2004/0224476 | A1 | 11/2004 | Yamada et al. |
| 2004/0232466 | A1 | 11/2004 | Birner et al. |
| 2004/0266081 | A1 | 12/2004 | Oh et al. |
| 2005/0017240 | A1 | 1/2005 | Fazan |

| | | | |
|---|---|---|---|
| 2005/0042833 A1 | 2/2005 | Park et al. | |
| 2005/0063224 A1 | 3/2005 | Fazan et al. | |
| 2005/0066892 A1 | 3/2005 | Dip et al. | |
| 2005/0104156 A1 | 5/2005 | Wasshuber | |
| 2005/0106820 A1* | 5/2005 | Tran | 438/270 |
| 2005/0106838 A1 | 5/2005 | Lim et al. | |
| 2005/0124130 A1 | 6/2005 | Mathew et al. | |
| 2005/0167751 A1 | 8/2005 | Nakajima et al. | |
| 2006/0043449 A1 | 3/2006 | Tang et al. | |
| 2006/0046407 A1 | 3/2006 | Juengling | |
| 2006/0046424 A1 | 3/2006 | Chance et al. | |
| 2006/0083058 A1 | 4/2006 | Ohsawa | |
| 2006/0167741 A1 | 7/2006 | Ramachandra | |
| 2006/0194410 A1 | 8/2006 | Sugaya | |
| 2006/0216894 A1 | 9/2006 | Parekh et al. | |
| 2006/0216922 A1 | 9/2006 | Tran et al. | |
| 2006/0261393 A1 | 11/2006 | Tang et al. | |
| 2006/0264001 A1 | 11/2006 | Tran et al. | |
| 2007/0001222 A1 | 1/2007 | Orlowski et al. | |
| 2007/0045712 A1* | 3/2007 | Haller et al. | 257/315 |
| 2007/0048941 A1 | 3/2007 | Tang et al. | |
| 2007/0048942 A1 | 3/2007 | Hanson et al. | |
| 2007/0096204 A1* | 5/2007 | Shiratake | 257/330 |
| 2007/0117310 A1 | 5/2007 | Bai et al. | |
| 2007/0128856 A1 | 6/2007 | Tran et al. | |
| 2007/0138526 A1 | 6/2007 | Tran et al. | |
| 2007/0148984 A1 | 6/2007 | Abatchev et al. | |
| 2007/0158719 A1 | 7/2007 | Wang | |
| 2007/0166920 A1 | 7/2007 | Tang et al. | |
| 2007/0178641 A1 | 8/2007 | Kim et al. | |
| 2007/0238299 A1 | 10/2007 | Niroomand et al. | |
| 2007/0238308 A1 | 10/2007 | Niroomand et al. | |
| 2007/0261016 A1 | 11/2007 | Sandhu et al. | |
| 2008/0012056 A1 | 1/2008 | Gonzalez | |
| 2008/0012070 A1 | 1/2008 | Juengling | |
| 2008/0099847 A1 | 5/2008 | Tang et al. | |
| 2008/0142882 A1 | 6/2008 | Tang et al. | |
| 2008/0166856 A1 | 7/2008 | Parekh et al. | |
| 2008/0299774 A1 | 12/2008 | Sandhu et al. | |
| 2008/0311719 A1 | 12/2008 | Tang et al. | |
| 2009/0035655 A1 | 2/2009 | Tran | |

FOREIGN PATENT DOCUMENTS

| | | |
|---|---|---|
| DE | 19928781 | 7/2000 |
| EP | 0453998 | 10/1991 |
| EP | 1003219 | 5/2000 |
| EP | 1067597 | 1/2001 |
| EP | 1089344 | 4/2001 |
| EP | 1271632 | 1/2003 |
| EP | 1391939 | 2/2004 |
| KR | 19930006930 | 4/1993 |
| KR | 19940006679 | 4/1994 |
| TW | 574746 | 2/2004 |
| TW | 200411832 | 7/2004 |
| WO | WO 8603341 | 6/1986 |
| WO | WO97/44826 | 11/1997 |
| WO | WO02/089182 | 11/2002 |
| WO | WO 2005083770 | 9/2005 |
| WO | 2007/001953 | 8/2008 |
| WO | PCT/US2007/016573 | 2/2009 |

OTHER PUBLICATIONS

PCT/US2004/034587, Jun. 9, 2005, PCT Search Report.
Clarke, "Device Structures Artchitectures compatible with conventional silicon processes—Vertical transistors plumbed for memory, logic", Abstract, Electronic Engineering Times, Feb. 14, 2000, p. 24.
Keast et al., "Silicon Contact Formation and Photoresist Planarization Using Chemical Mechanical Polishing", 1994 ISMIC, pp. 204-205.
Lamemrs, "Bell Labs opens gate to deeper-submicron CMOS", Abstract, Electronic Engineering Times, Dec. 6, 1999, p. 18.
Risch et al., "Vertical MOS Transistors with 70 nm Channel Length", IEEE Transactions on Electron Devices, vol. 43, No. 9, Sep. 1996, pp. 1495-1498.
US2007-016573, Jan. 25, 2008, PCT Written Opinion.
US2007-016573, Jan. 25, 2008, PCT Search Report.
Henkels, W.H. et al., "Large-Signal 2T 1C DRAM Cell: Signal and Layout Analysis", 8107 IEEE J. of Solid-State Circuits 29 (Jul. 1994), No. 7, pp. 829-832.
U.S. Appl. No. 11/218,184, filed Aug. 31, 2005, Haller et al.
C. Kuo et al., *A Capacitorless Double-Gate DRAM Cell Design for High Density Applications*, IEEE, pp. 843-846 IEDM (2002).
U.S. Appl. No. 12/537,470, filed Aug. 7, 2009, Tang et al.
PCT/US2005/030668, Oct. 2, 2006, Search Report.
PCT/US2005/030668, Oct. 2, 2006, Written Opinion.
PCT/US2006/008295, Aug. 3, 2006, IPRP.
PCT/US2006/008295, Aug. 3, 2006, Written Opinion.
PCT/US2006/008295, Aug. 3, 2006, Search Report.
PCT/US2006/008295, Aug. 3, 2006, Response to Written Opinion.
PCT/US2006/031555, Dec. 22, 2006, Search Report.
PCT/US2006/031555, Dec. 22, 2006, Written Opinion.
PCT/US2007/014689, Jan. 14, 2008, Inv to Pay Additional Fees.
PCT/US2007/014689, Apr. 9, 2008, Written Opinion.
PCT/US2007/014689, Apr. 9, 2008, Search Report.
PCT/US2007/019592, Nov. 2, 2008, Written Opinion.
PCT/US2007/019592, Nov. 2, 2008, Search Report.
PCT/US2007/019592, Mar. 19, 2009, IPRP.
PCT/US2007/023767, May 8, 2008, Search Report.
PCT/US2007/023767, May 8, 2008, Written Opinion.
PCT/US2007/023767, May 19, 2009, IPRP.
Barth, "ITRS commodity memory roadmap", IEEE Xplore, Jul. 28, 2003, Abstract.
Bashir et al., "Characterization of sidewall defects in selective epitaxial growth of silicon", American Vacuum Society, May/Jun. 1995, pp. 923-927.
Bashir et al., "Reduction of sidewall defect induced leakage currents by the use of nitrided field oxides in silicon selective epitaxial growth isolation for advanced ultralarge scale integration", American Vacuum Society, Mar./Apr. 2000, pp. 695-699.
Bernstein et al., Chapter 3, 3.4-3.5, SOI Device Electrical Properties, pp. 34-53.
Bhave, et al., "Developer-soluble Gap fill materials for patterning metal trenches in Via-first Dual Damascene process", 2004 Society of Photo-Optical Instrumentation Engineers, Proceedings of SPIE: Advances in Resist Technology and Processing XXI, vol. 5376, 2004.
Chen et al., "The Enhancement of Gate-Induced-Drain-Leakage (GIDL) Current in Short-Channel SOI MOSFET and its Application in Measuring Lateral Bipolar Current Gain B," IEEE Electron Device Letters, vol. 13, No. 11, pp. 572-574 (Nov. 1992).
Choi et al., "Investigation of Gate-Induced Drain Leakage (GIDL) Current in Thin Body Devices: Single-Gate Ultrathin Body, Symmetrical Double-Gate, and Asymmetrical Double-Gate MOSFETs" JPN. J. Appl. Phys., vol. 42, pp. 2073-2076 (2003).
Fazan et al., "MOSFET design simplifies DRAM", EE Times, May 13, 2002, pp. 1-4.
Gonzalez et al., "A dynamic source-drain extension MOSFET using a separately biased conductive spacer", Solid-State Electronics, vol. 46, pp. 1525-1530 (2002).
Hammad et al., "The Pseudo-Two-Dimensional Approach to Model the Drain Section in SOI MOSFETs", 2001 IEEE Transactions on Electron Devices, vol. 48, No. 2, Feb. 2001, pp. 386-387.
Hara, "Toshiba cuts capacitor from DRAM cell design", EE Times, Feb. 7, 2002, pp. 1-3.
Kim H.S. et al., "An Outstanding and Highly Manufacturable 80nm DRAM Technology", 2003 IEEE, 4 pages.
Kuo et al., "A Capacitorless Double-Gate DRAM Cell Design for High Density Applications", IEEE, IEDM, pp. 843-846 (2002).
Liu, "Dual-Work-Function Metal Gates by Full Silicidation of Poly-Si with Co-Ni Bi-Layers", 2005 IEEE, vol. 26, No. 4, Apr. 2005, pp. 228-230.
Lusky, et al., "Investigation of Channel Hot Electron Injection by Localized Charge-Trapping Nonvolatile Memory Devices", IEEE Transactions on Electron Devices, vol. 51, No. 3, Mar. 2004, pp. 444-451.

Maeda et al., "Impact of a Vertical Pi-Shape Transistor (VPiT) Cell for 1 Gbit DRAM and Beyond", IEEE Transactions on Electron Devices Dec. 1995, No. 12, pp. 2117-2124.

Minami et al., "A Floating Body Cell (FBC) Fully Compatible with 90nm CMOS Technology (CMOS IV) for 128Mb SOI DRAM", IEEE, 2005, 4 pages.

Minami et al., "A High Speed and High Reliability MOSFET Utilizing an Auxiliary Gate", 1990 Symposium on VLSI Technology, IEEE, pp. 41-42 (1990).

Mo et al., "Formation and Properties of ternary silicide (CoxNi1-x) Si2 thin films", 1998 IEEE, pp. 271-274.

Ranica et al., "A One Transistor Cell on Bulk Substrate (1T-Bulk) for Low-Cost and High Density eDRAM", 2004 Symposium on VLSI Technology Digest of Technical Papers, pp. 128-129.

Sivagnaname et al., "Stand-by Current in PD-SOI Pseudo-nMOS Circuits", 2003 IEEE, pp. 95-96.

Sunouchi et al., "Double LDD Concave (DLC) Structure for Sub-Half Micron MOSFET", IEEE, IEDM, pp. 226-228 (1988).

Tanaka et al., "Scalability Study on a Capacitorless 1T-DRAM: From Single-gate PD-SOI to Double-gate FinDRAM", IEEE, 2004, pp. 37.5.1-37.5.4.

Tiwari et al., "Straddle Gate Transistors: High Ion/Ioff Transistors at Short Gate Lengths", IBM Research Article, pp. 26-27 (pre-Mar. 2006).

Villaret, "Mechanisms of charge modulation in the floating body of triple-well nMOSFET capacitor-less DRAMs", Microelectronic Engineering 72, 2004, pp. 434-439.

Wang et al., "Achieving Low junction capacitance on bulk SI MOSFET using SDOI process", Micron Technology, Inc., 12 pages.

Yoshida et al., "A Capacitorless 1T-Dram Technology Using Gate-Induced Drain-Leakage (GIDL) Current for Low-Power and High-Speed Embedded Memory", IEEE Transactions on Electron Devices, vol. 53, No. 4, pp. 692-697 (Apr. 2006).

Yoshida et al., "A Design of a Capacitorless 1T-DRAM Cell Using Gate-induced Drain Leakage (GIDL) Current for Low-power and High-speed Embedded Memory", 2003 IEEE, 4 pages.

Kim et al., "The Breakthrough in data retention time of DRAM using Recess-Chanell-Array Transistor (RCAT) for 88nm feature size and beyond", 2003 Symposium on VLSI Technology Digest of Technical Papers, 2 pages.

* cited by examiner

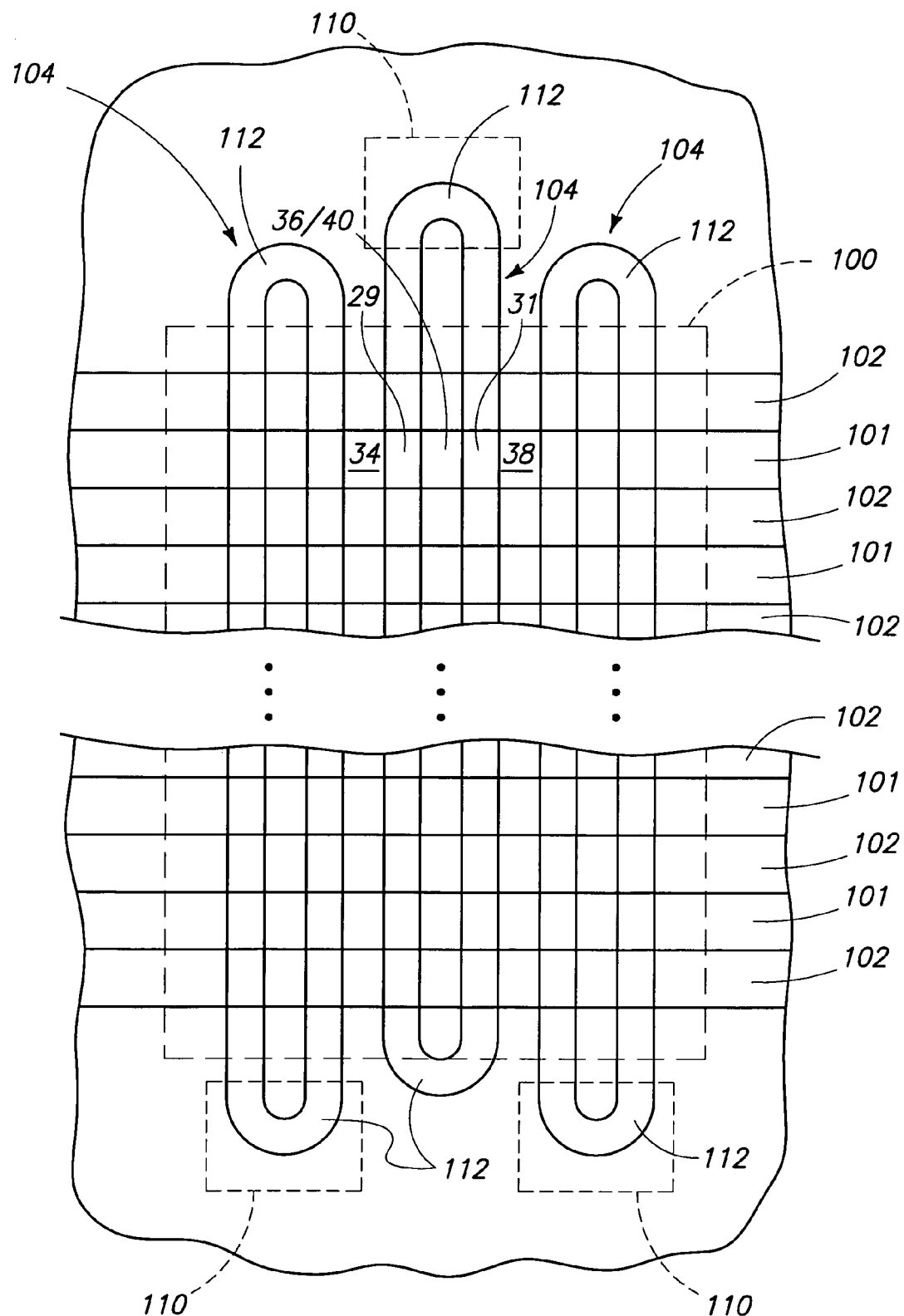
F I G 7

MEMORY ARRAYS AND METHODS OF FABRICATING MEMORY ARRAYS

TECHNICAL FIELD

This invention relates to memory arrays and to methods of fabricating memory arrays.

BACKGROUND OF THE INVENTION

Memory is one type of integrated circuitry, and is used in computer systems for storing data. Such is typically fabricated in one or more arrays of individual memory cells. The memory cells might be volatile, semi-volatile, or non-volatile. Non-volatile memory cells can store data for extended periods of time, and in many instances including when the computer is turned off. Volatile memory dissipates and therefore requires to be refreshed/rewritten, and in many instances including multiple times per second.

One example volatile semiconductor memory is dynamic random access memory (DRAM), with an exemplary prior art DRAM cell being shown in FIG. 1. FIG. 1 depicts an individual/single DRAM cell 10 comprising a field effect access transistor 12 and a storage capacitor 14. Field effect transistor 12 includes a pair of source/drain regions 15, 16, and a gate 17. Source/drain region 16 is depicted as connecting with storage capacitor 14, while source/drain region 15 electrically connects with a bit line 18. Gate 17 is typically in the form of an elongated word line forming gates of several field effect transistors formed in a "row". Bit line 18 typically connects with a plurality of source/drain regions 15 of field effect transistors formed in a "column" which is generally typically orthogonal to a gate/word line row. In many instances, pairs of immediately adjacent field effect transistors might share a common source/drain region 15 to which a bit line electrically connects.

Dual transistor DRAM cells utilizing capacitors have also been proposed, for example those disclosed in U.S. Pat. No. 6,818,937.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Example embodiments of the invention are described below with reference to the following accompanying drawings.

FIG. 7 is a further expanded diagrammatic top plan view of a substrate fragment in accordance with embodiments of the invention.

DETAILED DESCRIPTION OF EXAMPLE EMBODIMENTS

This disclosure of the invention is submitted in furtherance of the constitutional purposes of the U.S. Patent Laws "to promote the progress of science and useful arts" (Article 1, Section 8).

Embodiments of the invention encompass memory arrays and methods of fabricating memory arrays. Memory array constructions might be fabricated by any method, and not necessarily limited by the methods of fabricating a memory array as disclosed herein. Likewise, methods of fabricating a memory array are not necessarily limited by the memory array constructions as disclosed herein.

Exemplary embodiments of memory array constructions are initially described with reference to FIG. 2. In various implementations, memory arrays fabricated in accordance with the invention comprise a plurality of memory cells formed on a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Example semiconductor substrates include bulk semiconductor substrates, for example bulk monocrystalline silicon. Embodiments of the invention might also, of course, be utilized in semiconductor-on-insulator substrates and any other substrate (whether existing or yet-to-be developed) within or upon which an operable memory array could be fabricated.

Figure 1:
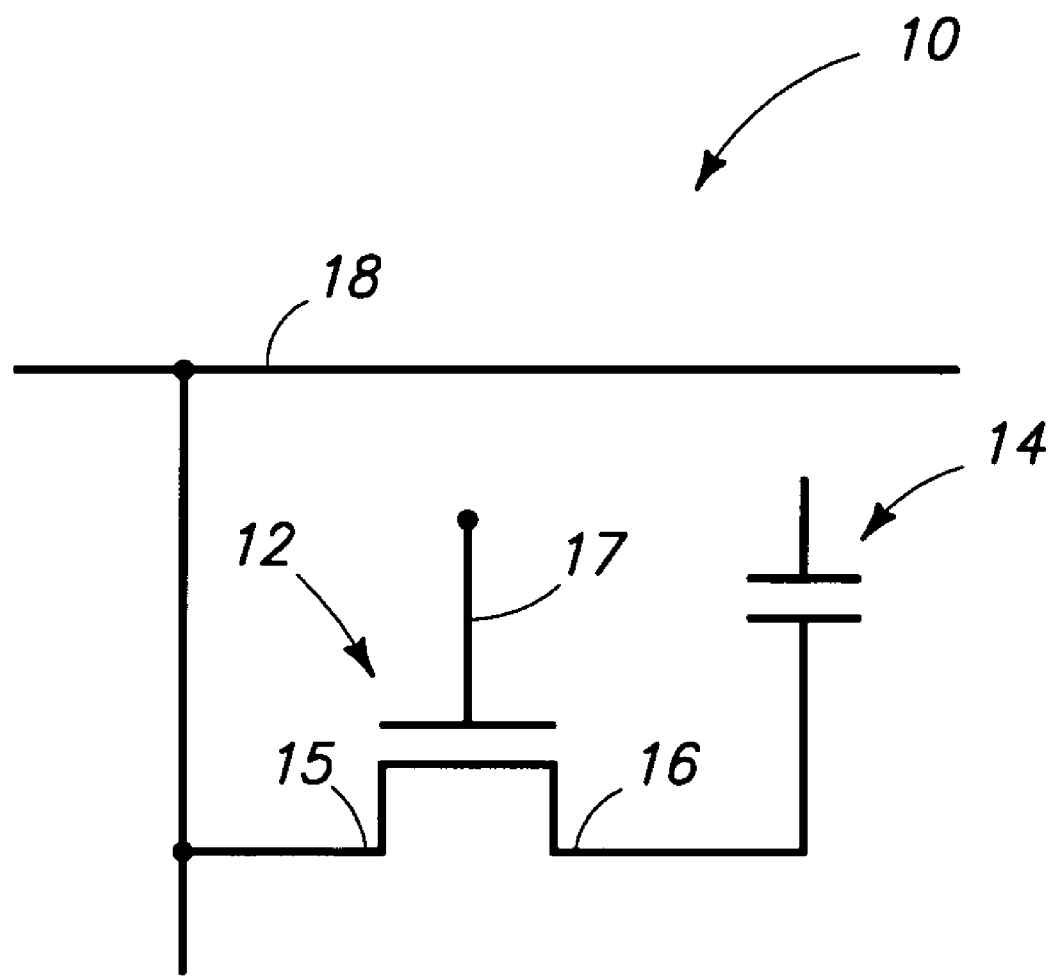
FIG. 1 is a schematic of a prior art DRAM cell.
Figure 2:
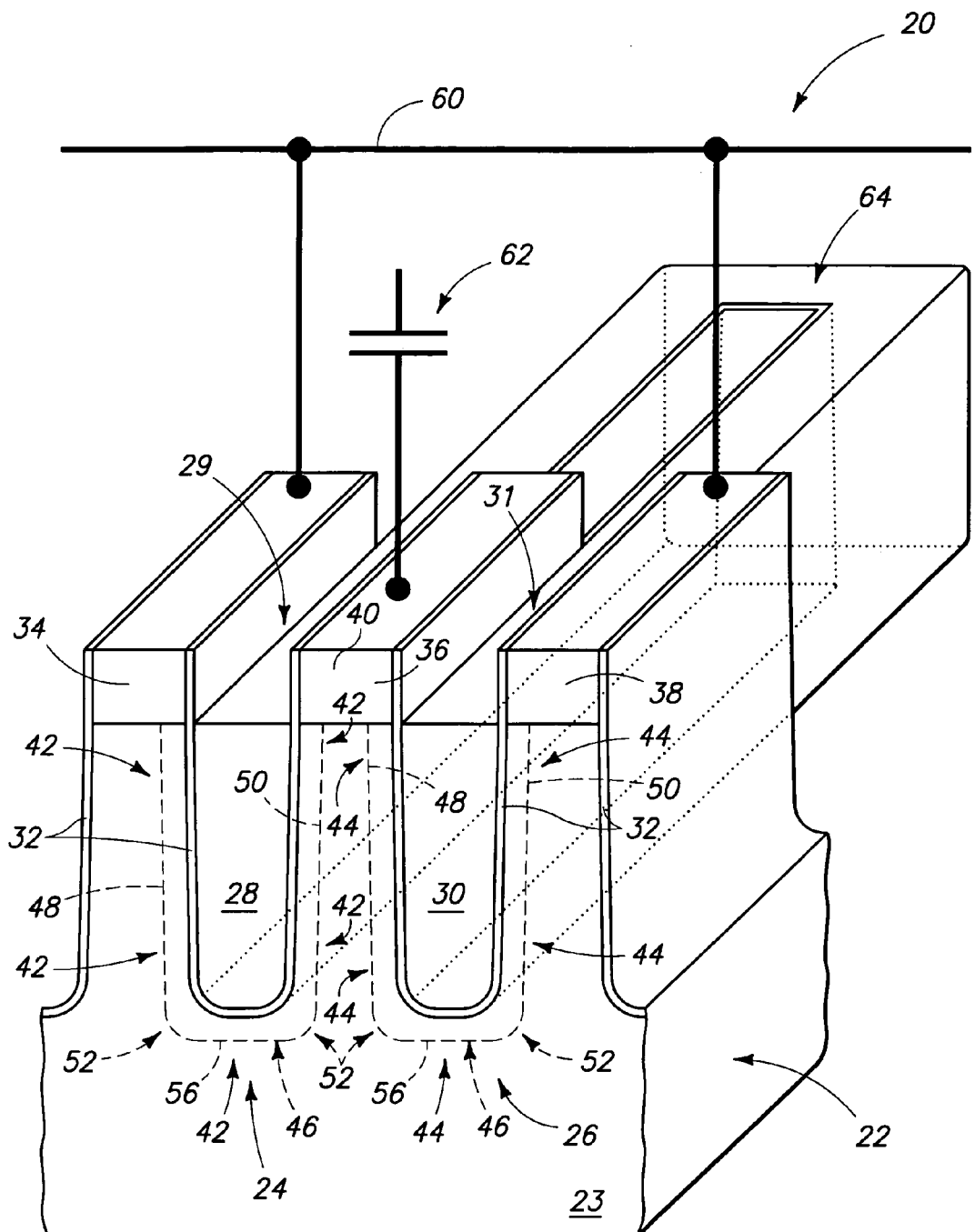
FIG. 2 is a diagrammatic perspective cutaway view of a substrate fragment and partial schematic comprising a memory cell in accordance with various embodiments of the invention.

The memory array will comprise a plurality of memory cells, with an exemplary individual memory cell in accordance with various implementations of the invention being indicated generally with reference numeral 20 in FIG. 2. Not all memory cells of a memory array necessarily have identical construction, but may and typically include a plurality of substantially identically constructed individual memory cells. Regardless and by way of example only, FIG. 2 depicts a semiconductor substrate 22 comprising semiconductive material 23. Semiconductive material 23 might comprise bulk semiconductor material, for example bulk monocrystalline silicon which has been suitably background doped with a conductivity-enhancing impurity either globally or relative to smaller isolated regions and/or wells. Other semiconductor materials and substrates are, of course, contemplated. By way of example only, exemplary background doping of semiconductive material 23 is of p-type of a suitable dose/concentration such that channel regions of n-type field effect transistors can be formed upon gate activation.

Individual memory cell 20 includes a first field effect transistor 24 and a second field effect transistor 26. Each comprises a gate, a channel region, and a pair of source/drain regions. For example, first field effect transistor 24 is depicted as comprising a gate 28, and second field effect transistor 26 is depicted as comprising a gate 30. In the depicted and but one example embodiment, gates 28 and 30 are received within openings 29 and 31, respectively, formed within semiconductive material 23 of semiconductor substrate 22. In one implementation, openings 29 and 31 are in the form of elongated trenches, and conductive material received therewithin will form word lines/gates for multiple memory cells. By way of example only, exemplary open widths of openings 29, 31 and the spacing between the depicted adjacent openings are preferably less than or equal to 500 Angstroms. An exemplary depth for the depicted trench openings 29 and 31 from an outermost surface of semiconductive material 23 is from 100 Angstroms to 500 Angstroms. Example conductive materials for gates 28 and 30 are conductively doped semiconductive materials and/or metal. In the context of this document, "metal" defines any of an elemental metal, an alloy or mixture of elemental metals, or conductive metal compounds. By way of example only, one example conductive material for gates 28 and 30 is titanium nitride.

A gate dielectric 32 is depicted as lining openings 29 and 31. Any suitable existing or yet-to-be developed dielectric is usable, with silicon dioxide being but one example, and of an example thickness range of from 30 Angstroms to 80 Angstroms.

First field effect transistor 24 comprises a pair of source/drain regions 34 and 36, and second field effect transistor 26 comprises a pair of source/drain regions 38 and 40. Such can be formed by any of ion implanting, diffusion doping, etc., and any other process whether existing or yet to be developed. An example thickness of such source/drain regions 34, 36, 38 and 40 is less than or equal to 500 Angstroms from an outer surface of material 23. In the depicted example embodiment, one of the pair of source/drain regions is received laterally intermediate gates 28 and 30, and is shared by first and second transistors 24 and 26. In the depicted exemplary embodiment, source/drain region 36 of first field effect transistor 24 and source/drain region 40 of second field effect transistor 26 constitute the same source/drain region and which is shared by such first and second field effect transistors. In one implementation, and as shown, other source/drain region 34 of pair 34/36 is received laterally outward of gate 28, and other source/drain region 38 of pair 38/40 is received laterally outward of gate 30. In the depicted example embodiment, shared source/drain region 36/40 is received both laterally intermediate gates 28 and 30, and elevationally outward thereof. Further in the depicted embodiment, each of other source/drain regions 34 and 38 is received elevationally outward of gates 28 and 30, and with the depicted source/drain regions being formed in one implementation within bulk semiconductive material 23. However, other constructions are of course contemplated, including, by way of example only, elevated source/drains.

First field effect transistor 24 comprises a channel region 42 and second field effect transistor 26 comprises a channel region 44. In combination, and in but one embodiment, such form a general W-shape in the depicted cross-section. Each channel region 42, 44 comprises a switchable current path 46 in at least one substrate cross-section which extends between shared source/drain region 36/40 and the respective other source/drain region 34 or 38. Preferably as shown, each current path 46 comprises interconnected first and second substantially vertical segments 48 and 50. In the depicted exemplary embodiment, first and second substantially vertical segments 48 and 50, respectively, can be considered as comprising elevationally inner end portions 52, and an interconnecting segment 56 received between first substantially vertical segment 48 and second substantially vertical segment 50 proximate elevationally inner end portions 52. In the depicted exemplary implementation, interconnecting segment 56 is substantially horizontally oriented relative to the depicted general substrate orientation.

FIG. 2 schematically depicts a conductive data line 60 electrically connecting with each of the other source/drain regions 34, 38 of source/drain region pair 34/36 and source/drain region pair 38/40. In one example embodiment, conductive data line 60 is received elevationally outward of gates 28 and 30. FIG. 2 also schematically depicts a charge storage device 62 electrically connecting with shared source/drain region 36/40. In the depicted example embodiment, charge storage device 62 comprises a capacitor.

FIG. 2 schematically depicts conductive data line 60 and charge storage device 62 electrically connecting with their respective source/drain regions, and such might occur in any manner or in any implementation. In one example embodiment, charge storage device 62 is received elevationally outward of gates 28 and 30, and in one example embodiment conductive data line 60 is received elevationally outward of gates 28 and 30. Further in one example embodiment, charge storage device 62 is received elevationally outward of conductive data line 60, for example in one embodiment as will be exemplified in the continuing discussion. Further in one example embodiment, individual memory cells 20 comprise DRAM cells, with conductive data line 60 comprising a bit line.

In one example embodiment, conductive material electrically interconnects gates 28 and 30 of first and second transistors 24 and 26, respectively. For example, FIG. 2 diagrammatically depicts a conductive material region or segment 64 which electrically connects conductive gates 28 and 30. In one exemplary implementation, conductive material 64 which interconnects with gates 28 and 30 is received within a trench which has been formed within semiconductor substrate 22, and even more preferably within semiconductive material 23 of semiconductor substrate 22. Material 23 and likely peripheral insulative material 32 are not shown proximate conductive material 64 for clarity in the depicted diagrammatic perspective cut-away in FIG. 2.

Figure 3:
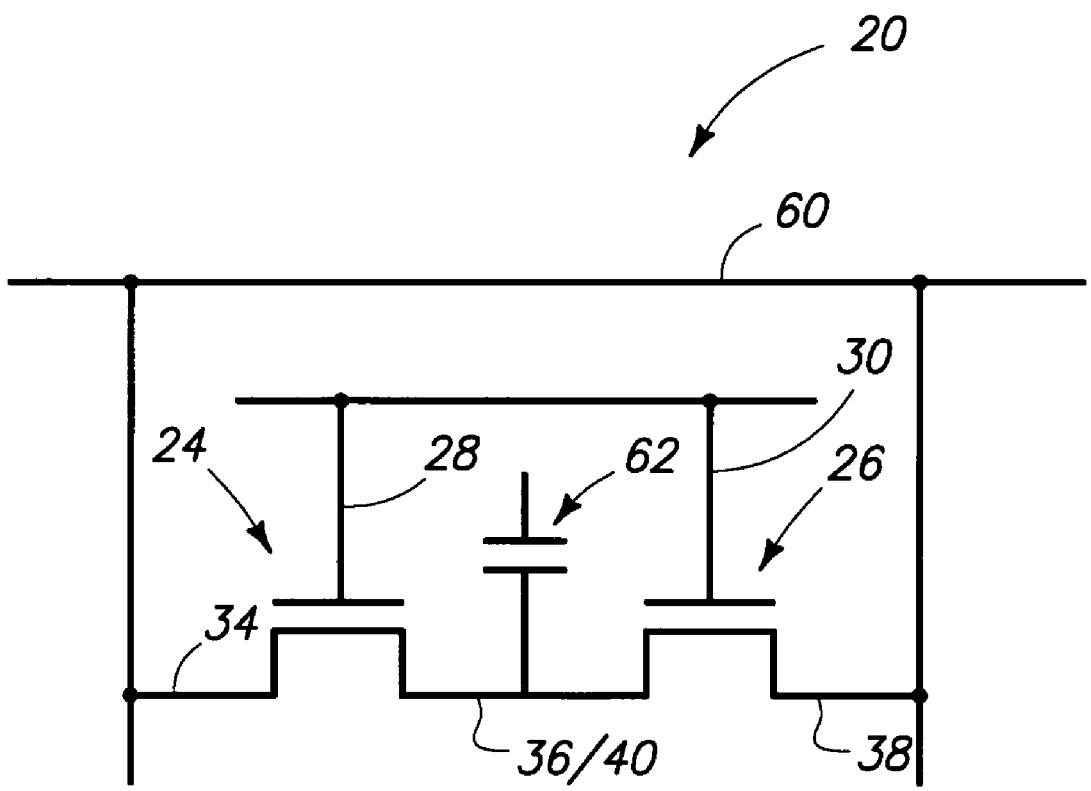
FIG. 3 is a schematic of a single/individual memory cell in accordance with an embodiment of the invention.

One embodiment of the invention includes a memory array which comprises a plurality of memory cells formed on a semiconductor substrate. Individual ones of the memory cells comprise first and second field effect transistors respectively comprising a gate, a channel region, and a pair of source/drain regions. The gates of the first and second field effect transistors are hardwired together. A conductive data line is hardwired to two of the source/drain regions, and a charge storage device is hardwired to at least one of the source/drain regions other than the two. For example, and by way of example only, FIG. 2 diagrammatically depicts an example construction of an individual memory cell of such a memory array, and FIG. 3 schematically depicts such an exemplary individual memory cell.

In one embodiment, one of the source/drain regions is received laterally between the gates. In one embodiment, one of the source/drain regions is shared by the first and second field effect transistors, and in one embodiment the charge storage device is connected to the one shared source/drain region. In one embodiment, the gates are hardwired together by conductive material received in at least one trench formed within semiconductive material of the semiconductor substrate and extending between the gates. However, other embodiments of electrically interconnecting gates are contemplated, for example by a separate interconnecting line or layer, or by any other manner whether existing or yet-to-be developed, and for any aspect of this disclosure. In one embodiment, each channel region comprises a current path in at least one cross-section extending between source/drain regions which comprises interconnected first and second substantially vertical segments. Any other exemplary attribute of the first-described FIG. 2 embodiment is also contemplated.

Figure 4:
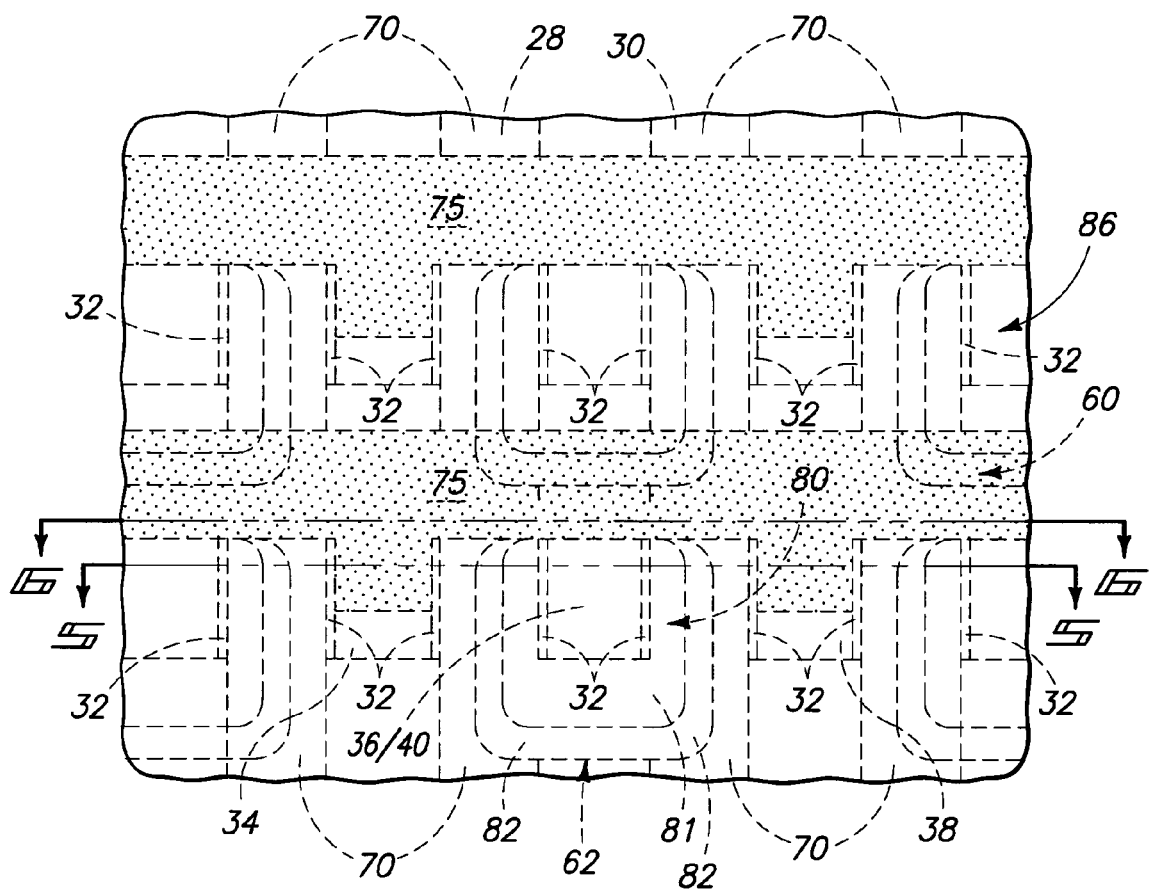
FIG. 4 is an expanded diagrammatic top plan view of a substrate fragment comprising memory cells such as that depicted in FIG. 2.
Figure 5:
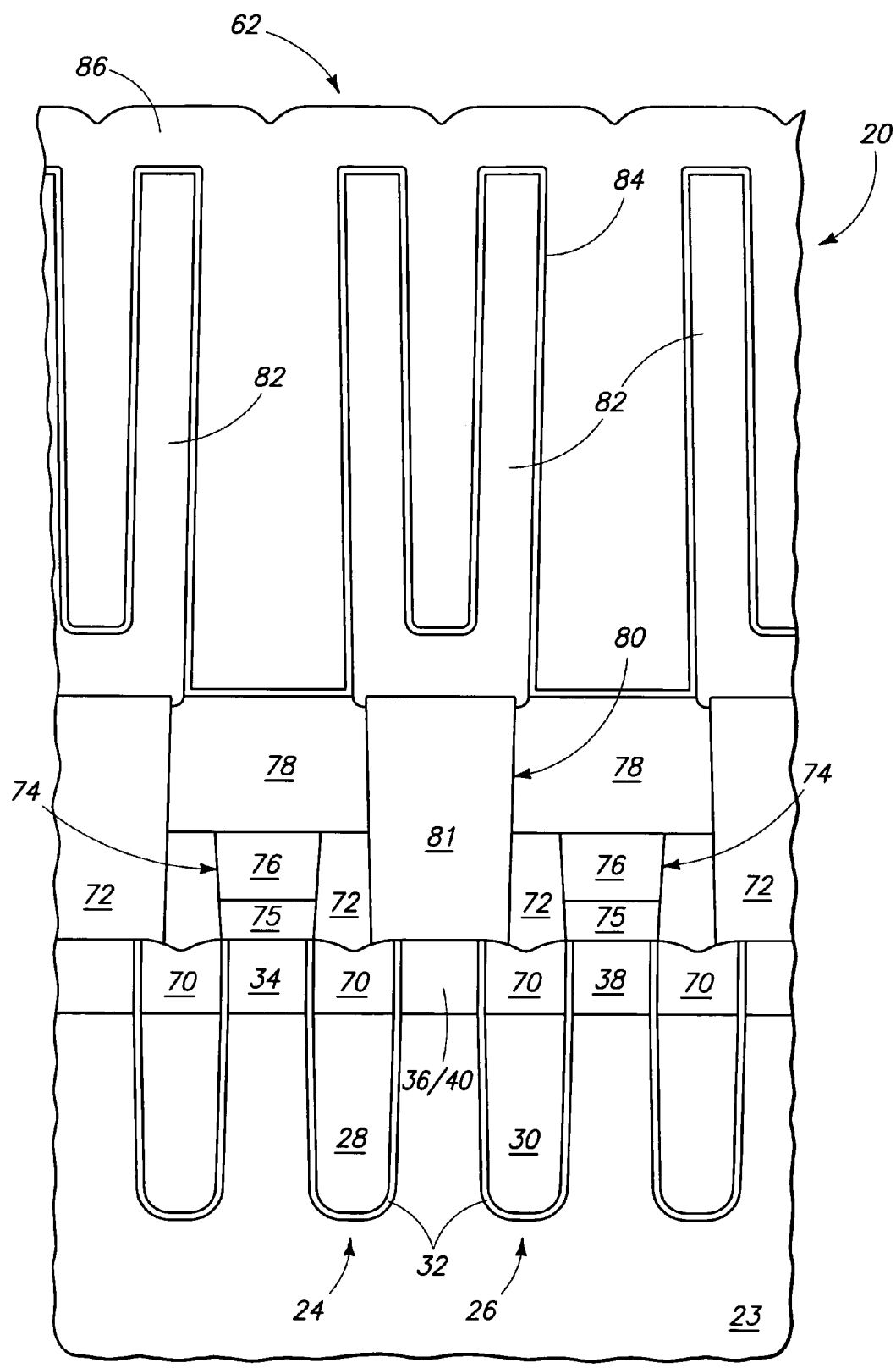
FIG. 5 is a diagrammatic sectional view taken through line 5-5 in FIG. 4.
Figure 6:
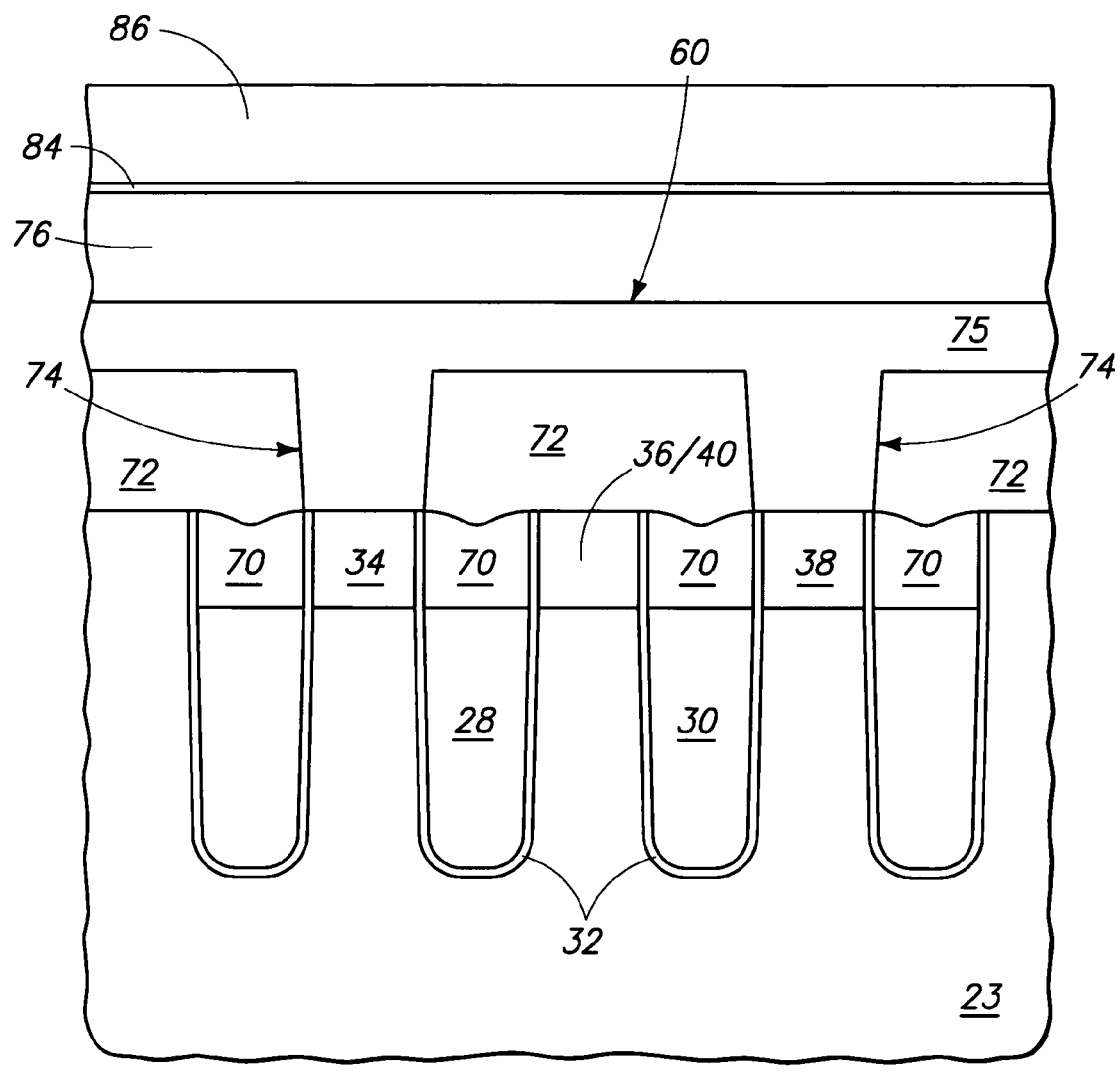
FIG. 6 is a diagrammatic sectional view taken through line 6-6 in FIG. 4.

By way of example only, FIGS. 4-6 depict but exemplary additional construction with respect to that of FIG. 2 incorporating conductive data line and charge storage device structures. Like numerals from FIG. 2 are utilized where appropriate, with additional structure being indicated with additional numerals. Insulative caps 70 are received over conductive gates 28, 30. An example material is silicon nitride. An interlevel dielectric 72 has been formed elevationally outward of semiconductive material 23. An exemplary material is silicon dioxide which might be doped or undoped. Conductive data line contact openings 74 have been formed therethrough to source/drain regions 34 and 38. Conductive material 75 has been deposited and patterned to form conductive data line 60. Such might be formed by a damascene-like process, or by a deposition and subtractive patterning and etch process, by way of examples only. One example method includes the deposition of one or more conductive materials 75, followed by subsequent patterning and subtractive etching thereof. An insulative material 76 might be deposited thereover prior or subsequent to patterning material 75, and the same or different insulative material 76 deposited and subsequently anisotropically etched to form insulative conductive data line sidewall spacers (not shown). Etching to form data line 60 might effectively recess material 75 within contact openings 74 as depicted in the FIG. 5 cross-section, and with some insulative spacer-forming material 76 subsequently being deposited therein over material 75 in the FIG. 5 cross-section.

Another interlevel dielectric layer 78 (FIG. 5) has been deposited. Example materials include doped or undoped silicon dioxide. A contact opening 80 has been etched through interlevel dielectric layer 78 and 72 to shared source/drain region 36/40. Conductive plugging material(s) 81 is received therein. Charge storage device 62 is depicted as comprising a capacitor having a storage node electrode 82 electrically connecting with conductive plug 81 received within contact opening 80. A capacitor dielectric 84 is received outwardly and over storage node electrode 82, and an outer conductive cell plate electrode 86 has been formed thereover. Any exemplary or yet-to-be developed materials are, of course, contemplated for capacitor dielectric 84 and conductive capacitor electrodes 82 and 86.

The depicted FIG. 2 and FIGS. 4-6 constructions are but exemplary depictions of an individual memory cell and of a memory array in accordance with various embodiments of the invention. A person of skill in the art will readily appreciate that such might be manufactured in any of numerous manners, and whether existing or yet-to-be developed. By way of example only, exemplary inventive embodiments of methods of fabricating memory arrays are described with reference to FIG. 7. FIG. 7 is a top view of a semiconductor substrate comprising, by way of example only, a memory array area 100. Alternating lines 101 of active area regions and lines 102 of trench isolation regions have been formed within a suitable semiconductor substrate, for example substrate 22 of the first-described embodiment. A series of race track-shaped trenches 104 have been etched into active area regions 101 and trench isolation regions 102 generally orthogonal to the alternating lines of active area regions 101 and trench isolation regions 102. By way of example only, such can be in the form of openings 29 and 31 of FIG. 2 for the fabrication of individual memory cells. Conductive material is formed within race track-shaped trenches 104 to form a pair of electrically connected word lines with respect to individual ones of the race track-shaped trenches. Example materials are those described above with respect to gates 28 and 30. Accordingly and also in one example embodiment, a gate dielectric (not shown for clarity in FIG. 7) would be formed to line the exemplary depicted race track-shaped trenches 104 prior to provision of gate material 28/30.

Source/drain regions could be formed within the active area regions laterally internal of race track-shaped trenches 104 and laterally external of race track-shaped trenches 104. By way of example only, and with reference to the FIG. 2 embodiment, an exemplary such laterally internal source/drain region is designated with 36/40, and exemplary such laterally external source/drain regions are designated with numerals 34 and 38 in FIG. 7.

Conductive data lines (not shown for clarity in FIG. 7) are formed in electrical connection with the source/drain regions received laterally external of the race track-shaped trenches, for example to source/drain regions 34 and 38 of the exemplary FIGS. 2 and 4-6 embodiments. A charge storage device (not shown for clarity in FIG. 7) is formed in electrical connection with a respective one of the source/drain regions received laterally internal of race track-shaped trenches 104. For example and by way of example only, capacitors or other devices might be formed relative to source/drain regions 36/40 of the FIGS. 2 and 4-6 embodiments. Exemplary separate conductive contacts 110 are shown, by way of example only, received externally of memory array 100 for making electrical connection with respect to conductive material (i.e., conductive materials 28 and 30 with respect to each trench 104) for accessing/activating each word/gate line pair.

An embodiment of the invention encompasses a method of fabricating a memory array which comprises forming alternating lines of active area regions and trench isolation regions within a semiconductor substrate. Exemplary such alternating lines are depicted in FIG. 7, and by way of example only. A series of pairs of trenches are etched into the active area regions and the trench isolation regions generally orthogonal to the alternating lines of active area regions and trench isolation regions. By way of example only, exemplary depicted trench openings 29 and 31 in FIG. 7 are exemplary such series of pairs of trenches, and independent of whether race track-shaped trenches are formed.

Regardless in one implementation, at least one interconnecting trench is etched somewhere within the semiconductor substrate which interconnects individual ones of the trenches of each pair. For example and by way of example only, each of the exemplary depicted half-circle/arch trench sections 112 are an exemplary such interconnecting trench which interconnects respective trench pairs 29 and 31. Only one of such trenches 112 might be fabricated or alternate shaped or configuration trenches might be etched. Further, the exemplary pairs of trenches might be etched at the same time and/or using a common masking step, or separately with respect to masking step and/or etching.

Conductive material is formed within the pairs of trenches and the interconnecting trench to form a pair of electrically connected word lines with respect to individual ones of the pairs of trenches. Such might comprise depositing at least some conductive material within the pairs of trenches and the interconnecting trench at the same time, or at totally at different times. (Interconnecting material/region 64 in FIG. 2 corresponds to such interconnecting trench and conductive material).

Source/drain regions are formed within the active area regions intermediate individual ones of the trenches of each pair, and laterally external of individual ones of the trenches of each pair. Conductive data lines are formed in electrical connection with the source/drain regions received laterally external of individual ones of the trenches of each pair. A charge storage device is formed in electrical connection with respective ones of the source/drain regions received intermediate individual ones of the trenches of each pair. By way of example only, such is depicted with reference to the embodiments of FIG. 2 and FIGS. 4-6.

The above-described exemplary FIG. 2, FIGS. 4-6 and FIG. 7 embodiments might be manufactured by any of a number of existing or yet-to-be developed techniques. Further by way of example only, the depicted trench openings 29, 31 in FIGS. 2, 4-6 and 7 might be manufactured to be sublithographic. For example and by way of example only, trench opening outlines might be fabricated to the minimum capable lithographic feature size in a first hard-masking layer. Thereafter, additional suitably thin hard-masking material can be deposited thereover to line the sidewalls and bases of the trenches formed in the first hard-masking layer(s). Such could be subjected to an anisotropic spacer-like etch, thereby reducing the open width of the trenches prior to etching trench openings 29 and 31 into substrate material 23, and thereby form the depicted trenches to be sublithographic. Further, the hard-masking blocks between trenches might also be fabricated to be sublithographic in an analogous manner by utilizing anisotropically etched hard-masking spacers deposited to a lateral thickness less than that of the then-present minimum photolithographic feature dimension.

Further and regardless, peripheral circuitry gate material might be deposited prior to forming trench openings 29, 31, with trench openings 29, 31 then formed through the peripheral circuitry gate material within array area prior to patterning the peripheral gate material to form field effect transistor gates in peripheral circuitry area. Further by way of example only, the exemplary depicted gate dielectric 32 and gate material(s) 28, 30 might be deposited and planarized back relative to the peripheral conductive gate material within the array prior to removing peripheral gate material from the array. Further and by way of example only, the exemplary depicted recessing of conductive gate material 28, 30 within the memory array might occur commensurate with the etching of peripheral gate material. Further, by way of example only, insulative material 70 formed over conductive gate material 28, 30 might be formed commensurate with the fabrication of, and of the same material as, insulative spacers formed with respect to peripheral gate constructions. Any other existing or yet-to-be developed processing is, of course, contemplated with respect to fabricating any of the structures identified and claimed herein, as well as in connection with methods of fabricating a memory array as claimed and described herein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A memory array comprising:
a plurality of memory cells, individual ones of the memory cells comprising:
first and second transistors, each of the first and second transistors respectively comprising a gate, a channel region, and a pair of source/drain regions; the gate of the first transistor and the gate of the second transistor each being within a respective opening formed in semiconductive material, one of the pair of source/drain regions of the first transistor and one of the pair of source/drain regions of the second transistor being laterally intermediate the gates of the first and second transistors and being shared by the first and second transistors, each of the other of the pair of source/drain regions of each of the first and second transistors being laterally outward of their respective gate;
a conductive data line elevationally outward of the gate of the first transistor and the gate of the second transistor, the conductive data line being electrically connected with the other of the pair of source/drain regions of the first transistor and with the other of the pair of source/drain regions of the second transistor; and
a charge storage device electrically connected with the shared source/drain region.

2. The memory array of claim 1 wherein the semiconductive material comprises bulk semiconductor material.

3. The memory array of claim 2 wherein the bulk semiconductor material comprises bulk monocrystalline silicon.

4. The memory array of claim 1 wherein the shared source/drain region is elevationally outward of the gate of the first transistor and the gate of the second transistor.

5. The memory array of claim 1 wherein each of the other of the pair of source/drain regions of each of the first and second transistors is elevationally outward of the gate of the first transistor and the gate of the second transistor.

6. The memory array of claim 1 wherein the shared source/drain region and each of the other of the pair of source/drain regions of each of the first and second transistors are elevationally outward of the gate of the first transistor and the gate of the second transistor.

7. The memory array of claim 1 wherein the charge storage device is elevationally outward of the gate of the first transistor and the gate of the second transistor.

8. The memory array of claim 1 wherein the charge storage device is elevationally outward of the gate of the first transistor and the gate of the second transistor and elevationally outward of the conductive data line.

9. The memory array of claim 1 wherein the channel region of the first transistor and the channel region of the second transistor each comprises a respective current path in at least one cross-section extending between the shared source/drain region and the respective other source/drain region, each of the current paths comprising interconnected first and second substantially vertical segments.

10. The memory array of claim 1 comprising conductive material electrically interconnecting the gates of the first and second transistors.

11. The memory array of claim 10 wherein the conductive material is within a trench formed within the semiconductive material.

12. The memory array of claim 10 wherein the conductive material is within a trench formed within the semiconductive material of a semiconductor substrate.

13. The memory array of claim 1 wherein,
the channel region of the first transistor and the channel region of the second transistor each comprises a respective current path in at least one cross-section extending between the shared source/drain region and the respective other source/drain region, each of the current paths comprising interconnected first and second substantially vertical segments; and
conductive material electrically interconnects the gates of the first and second transistors.

14. The memory array of claim 1 wherein the memory cells comprise DRAM cells.

15. A memory array comprising:
a plurality of memory cells, individual ones of the memory cells comprising:

first and second transistors, each of the first and second transistors respectively comprising a gate, a channel region, and a pair of source/drain regions; one of the pair of source/drain regions of the first transistor and one of the pair of source/drain regions of the second transistor being laterally intermediate the gates of the first and second transistors and being shared by the first and second transistors, each of the other of the pair of source/drain regions of the first and second transistors being laterally outward of their respective gate, the channel region of the first transistor and the channel region of the second transistor each comprising a respective current path in at least one cross-section extending between the shared source/drain region and the respective other source/drain region, each of the current paths comprising interconnected first and second substantially vertical segments;

a conductive data line electrically connected with the other of the pair of source/drain regions of the first transistor and with the other of the pair of source/drain regions of the second transistor; and a charge storage device electrically connected with the shared source/drain region.

16. The memory array of claim 15 wherein the first and second substantially vertical segments of each of the first and second transistors comprise elevationally inner end portions, each of the current paths in the one cross-section comprising an interconnecting segment between the respective first and second substantially vertical segments proximate the respective elevationally inner end portions.

17. The memory array of claim 15 wherein each of the current paths of the first transistor and the current path of the second transistor in the one cross-section comprises an interconnecting substantially horizontal segment between the respective first and second substantially vertical segments.

18. The memory array of claim 15 wherein the conductive data line is elevationally outward of the gate of the first transistor and the gate of the second transistor.

19. The memory array of claim 15 wherein the charge storage device is elevationally outward of the gate of the first transistor and the gate of the second transistor.

20. The memory array of claim 15 wherein the charge storage device is elevationally outward of the gate of the first transistor and the gate of the second transistor and elevationally outward of the conductive data line.

21. The memory array of claim 15 comprising conductive material electrically interconnecting the gates of the first and second transistors.

22. The memory array of claim 15 wherein the conductive data line comprises a bit line, and the memory cells comprise DRAM cells.

23. A memory array comprising:

a plurality of memory cells formed on a substrate, individual ones of the memory cells comprising:

first and second transistors, each of the first and second transistors respectively comprising a gate, a channel region, and a pair of source/drain regions; one of the pair of source/drain regions of the first transistor and one of the pair of source/drain regions of the second transistor being laterally intermediate the gates of the first and second transistors and being shared by the first and second transistors, each of the other of the pair of source/drain regions of the first and second transistors being laterally outward of their respective gate, conductive material electrically interconnecting the gates of the first and second transistors;

a conductive data line electrically connected with the other of the pair of source/drain regions of the first transistor and with the other of the pair of source/drain regions of the second transistor; and a charge storage device electrically connected with the shared source/drain region.

24. The memory array of claim 23 wherein the conductive material is within a trench formed within the substrate.

25. The memory array of claim 23 wherein the conductive material is within a trench formed within semiconductive material of the substrate.

26. The memory array of claim 23 wherein the conductive data line is elevationally outward of the gate of the first transistor and the gate of the second transistor.

27. The memory array of claim 23 wherein the charge storage device is elevationally outward of the gate of the first transistor and the gate of the second transistor.

28. The memory array of claim 23 wherein the charge storage device is elevationally outward of the gate of the first transistor and the gate of the second transistor and elevationally outward of the conductive data line.

29. The memory array of claim 23 wherein the charge storage device comprises a capacitor.

30. A memory array comprising:

a plurality of memory cells, individual ones of the memory cells comprising:

first and second transistors, each of the first and second transistors respectively comprising a gate, a channel region, and a pair of source/drain regions; each of the gate of the first transistor and the gate of the second transistor being within a respective trench formed within semiconductive material, one of the pair of source/drain regions of the first transistor and one of the pair of source/drain regions of the second transistor being within the semiconductive material laterally intermediate the gates of the first and second transistors and being shared by the first and second transistors, each of the other of the pair of source/drain regions of the first and second transistors being within the semiconductive material and laterally outward of their respective gate, conductive material electrically interconnecting the gates of the first and second transistors, the channel region of the first transistor and the channel region of the second transistor each comprising a respective current path within the semiconductive material in at least one cross-section extending between the shared source/drain region and the respective other source/drain region, each of the current paths comprising interconnected first and second substantially vertical segments;

a conductive data line elevationally outward of the gate of the first transistor and the gate of the second transistor and which electrically connects with each of the other of the pair of source/drain regions of the first transistor and with the other of the pair of source/drain regions of the second transistor; and a charge storage device electrically connected with the shared source/drain region, the charge storage device being elevationally outward of the conductive data line.

31. The memory array of claim 30 wherein the conductive material comprises metal.

32. The memory array of claim 31 wherein the metal comprises TiN.

33. A memory array comprising:
a plurality of memory cells formed on a semiconductor substrate, individual ones of the memory cells comprising:
first and second transistors respectively comprising a gate, a channel region, and a pair of source/drain regions; the gates of the first and second transistors being hardwired together, one of the pair of source/drain regions of the first transistor and one of the pair of source/drain regions of the second transistor being shared by the first and second transistors;
a conductive data line hardwired to two of the source/drain regions other than the one source/drain region and which electrically connects the two source/drain regions; and
a charge storage device hardwired to the one source/drain region.

34. The memory array of claim 33 wherein the one source/drain region is laterally between the gate of the first transistor and the gate of the second transistor.

35. The memory array of claim 33 wherein the gates are hardwired together by conductive material in at least one trench formed within semiconductive material of the semiconductor substrate and extending between the gate of the first transistor and the gate of the second transistor.

36. The memory array of claim 33 wherein the gates are hardwired together by conductive material in at least two trenches formed within semiconductive material of the semiconductor substrate and extending between the gate of the first transistor and the gate of the second transistor.

37. The memory array of claim 33 wherein the charge storage device is elevationally outward of the gate of the first transistor and the gate of the second transistor.

38. The memory array of claim 33 wherein the conductive date line is elevationally outward of the gate of the first transistor and the gate of the second transistor.

39. The memory array of claim 33 wherein each of the channel region of the first and the channel region of the second transistor comprises a respective current path in at least one cross-section extending between the respective pair of source/drain regions of the respective transistor, each of the current paths comprising interconnected first and second substantially vertical segments.

40. The memory array of claim 1 wherein the channel regions of the first and second transistors in combination form a general W-shape in cross-section.

41. The memory array of claim 1 wherein the openings are in the form of elongated trenches.

42. The memory array of claim 1 wherein width of each of the openings is less than or equal to 500 Angstroms.

43. The memory array of claim 1 wherein spacing between adjacent of the openings is less than or equal to 500 Angstroms.

44. The memory array of claim 1 wherein width of each of the openings is less than or equal to 500 Angstroms, and spacing between adjacent of the openings is less than or equal to 500 Angstroms.

45. The memory array of claim 1 wherein width of each of the openings is equal to spacing between adjacent of the openings.

46. The memory array of claim 1 wherein depth of each of the openings is from 100 Angstroms to 500 Angstroms from an outermost surface of the semiconductive material.

47. The memory array of claim 1 wherein the one and the other source/drain regions have a thickness less than or equal to 500 Angstroms from an outer surface of the semiconductive material.

48. The memory array of claim 1 wherein the one and the other source/drain regions comprise elevated source/drain regions.

49. The memory array of claim 1 wherein the one of the pair of source/drain regions of each of the first and second transistors laterally intermediate the gates and shared by the first and second transistors constitutes a same source/drain region.

50. A memory array comprising:
a plurality of memory cells, individual ones of the memory cells comprising:
first and second gates, a first source/drain region laterally intermediate the gate, a second source/drain region laterally outward of the first gate and a third source/drain region laterally outward of the second gate;
a conductive data line electrically connecting both the second source/drain region and third source/drain region; and
a charge storage device electrically connecting with the first source/drain region.

51. The memory array of claim 50 wherein the first and second gates are each within a respective opening formed within semiconductive material.

52. The memory array of claim 50 comprising conductive material electrically interconnecting the first and second gates.

53. The memory array of claim 50 wherein the first source/drain region is elevationally outward of the first and second gates.

54. The memory array of claim 50 wherein the conductive data line is elevationally outward of the first and second gates and the charge storage device is elevationally outward of the conductive data line.

55. The memory array of claim 50 wherein the first gate comprises a first gate line and the second gate comprising a second gate line, the first and second gate lines being spaced from one another.

56. The memory array of claim 55 wherein the first gate line and the second gate line have at least one pair of adjacent ends which are hardwired together.

57. The memory array of claim 56 wherein the at least one pair of adjacent ends are hardwired together externally of area in which the plurality of memory cells are received.

58. The memory array of claim 56 wherein the first gate line and the second gate line have two pairs of adjacent ends which are hardwired together.

59. A memory array, comprising:
alternating lines of active area regions and trench isolation regions within semiconductive material;
a series of pairs of trenches within the active area regions and the trench isolation regions generally orthogonal to the alternating lines of active area regions and trench isolation regions;
conductive material within the pairs of trenches forming a pair of word lines in each respective pair of trenches;
source/drain regions within the active area regions intermediate individual ones of the trenches of each pair of trenches and laterally external of the individual ones of the trenches of each pair of trenches;
conductive data lines in electrical connection with the source/drain regions laterally external of the individual ones of the trenches of each pair of trenches; and
charge storage devices in electrical connection with the source/drain regions intermediate individual ones of the trenches of each pair, wherein a memory cell of the memory array comprises a respective one of the source/ drain regions intermediate the individual trenches of a respective one of the pairs of trenches, a respective two of the source/drain regions that are laterally external of the individual trenches of the respective one of the pairs of trenches, and a respective one of the charge storage devices that is in electrical connection with the respective one of the source/drain regions intermediate the individual trenches of the respective one of the pairs of trenches.

* * * * *